United States Patent
Wang et al.

(10) Patent No.: US 6,294,483 B1
(45) Date of Patent: Sep. 25, 2001

(54) METHOD FOR PREVENTING DELAMINATION OF APCVD BPSG FILMS

(75) Inventors: Je Wang; Han-Chung Chen; Chiarn-Lung Lee, all of Hsin-chu (TW)

(73) Assignee: Taiwan Semiconductor Manufacturing Company, Hsin-chu (TW)

(*) Notice: Subject to any disclaimer, the term of this patent is extended or adjusted under 35 U.S.C. 154(b) by 0 days.

(21) Appl. No.: 09/567,418

(22) Filed: May 9, 2000

(51) Int. Cl.[7] .......................... H01L 21/31; H01L 21/469
(52) U.S. Cl. ............................ 438/783; 438/778
(58) Field of Search ................... 438/758, 778, 438/783, 784

(56) References Cited

U.S. PATENT DOCUMENTS

| | | | |
|---|---|---|---|
| 5,332,694 | 7/1994 | Suzuki | 437/195 |
| 5,518,962 | 5/1996 | Murao | 437/195 |
| 5,607,880 | 3/1997 | Suzuki et al. | 437/195 |
| 5,710,079 | 1/1998 | Sukharev | 438/778 |
| 5,736,450 | 4/1998 | Huang et al. | 438/396 |
| 5,840,631 | * 11/1998 | Kubo et al. | 438/789 |
| 6,090,675 | * 7/2000 | Lee et al. | 438/301 |
| 6,110,814 | * 8/2000 | Tokumasu et al. | 438/597 |

\* cited by examiner

*Primary Examiner*—Richard Elms
*Assistant Examiner*—Bradley Smith
(74) *Attorney, Agent, or Firm*—George O. Saile; Stephen B. Ackerman

(57) ABSTRACT

A method for forming BPSG layers over PECVD silicon oxide layers by atmospheric chemical vapor deposition using ozone and TEOS is described. The method prevents the formation of voids in deep depressions such as are found between metallization lines or closely spaced polysilicon structures in flash memory integrated circuits. The method deposits the BPSG layer at ozone/TEOS flow rate ratio of 12:1 or greater. The voids are caused by excessive shrinkage of the BPSG which produces high stresses in the depressions during planarization reflow causing the BPSG to become detached from the underlying silicon oxide. The voids are measured as line defects in a double polysilicon flash memory circuit. The high ozone/TEOS ratio increases the density of the as-deposited BPSG layer which in turn produces reduced shrinkage of the layer during the subsequent planarization reflow. A correlation is found between BPSG shrinkage and line yield.

9 Claims, 5 Drawing Sheets

METHOD FOR PREVENTING DELAMINATION OF APCVD BPSG FILMS

BACKGROUND OF THE INVENTION (1) Field of the Invention

The invention relates to processes for the manufacture of semiconductor devices and more particularly to processes related to formation of insulative layers for integrated circuits.

(2) Background of the Invention and Description of Previous Art

Integrated circuits(ICs) are manufactured by first forming discrete semiconductor devices within the surface of silicon wafers. A multi-level metallurgical interconnection network is then formed over the devices contacting their active elements and wiring them together to create the desired circuits. A conventional method for forming an interconnection wiring level begins by first depositing an insulating layer over the discrete devices, patterning and etching openings into this layer. A conductive layer is next applied over the insulating layer, patterned, and etched to form wiring interconnections between the device contacts thereby creating a first level of basic circuitry. In some applications conductive plugs are first formed in the openings prior to the deposition of the conductive layer. These basic circuits are then further interconnected by utilizing additional wiring levels laid out over additional insulating layers with conductive pass throughs. The conductive pass-throughs which access the active areas of the semiconductive devices through openings in the lowermost insulative layer are referred to as contacts while those pass-throughs which interconnect metallization levels are referred to as vias.

The insulative layers which separate the interconnection wiring layers are called upon to provide, in addition to electrical insulation of conductive components, good step coverage over the subjacent wiring pattern as well as a reasonably planar surface upon which to form the superjacent wiring pattern. In order to achieve these requirements, composite insulative layers are often used. A first insulative layer which can be applied with good edge coverage is applied over the wiring pattern. A second insulative layer, which can be directed towards surface planarization is then applied over the first.

Murao, U.S. Pat. No. 5,518,962 cites a relatively thin layer of BPSG (borophosphosilicate glass) deposited over a metallization pattern by a CVD (chemical vapor deposition) process. A layer of TEOS (tetraethoxysilane) silicon oxide deposited over the BPSG by an APCVD (atmospheric pressure chemical vapor deposition) process provides good step coverage. The TEOS silicon oxide layer is planarized by using a sacrificial SOG (spin-on glass) etchback planarization process. A second layer of APCVD TEOS silicon oxide then applied to complete the interlayer insulating film.

Huang, et. al., U.S. Pat. No. 5,736,450 cites the use of a dual layer dielectric film wherein a TEOS silicon oxide layer is deposited by SACVD (sub atmospheric chemical vapor deposition) over a BPSG layer deposited by PECVD (Plasma enhanced chemical vapor deposition). The fast etching TEOS oxide provides a favorable etch rate differential with respect to the BPSG. This permits the elimination of an etch stop layer in the application.

Suzuki, U.S. Pat. No. 5,332,694 cites a layer of PECVD silicon oxide deposited on an aluminum metal pattern. Like Murao, a second insulative layer of APCVD TEOS silicon oxide is deposited over the PECVD silicon oxide. A spin-on organosilicon coating is then used for etchback planarization. The APCVD silicon oxide has a good planarization etch rate compared to that of the spin-on coating, and no residual spin-on coating is left behind after the etchback planarization. This eliminated a problem of de-lamination of the APCVD silicon oxide from residual spin-on coating.

Suzuki, et. al., U.S. Pat. No. 5,607,880 first deposits a first silicon oxide layer over an aluminum pattern by PECVD and then subjects the surface of this layer to dry etching in a plasma containing a fluorine compound. This surface treatment eliminates bubbles and voids in a second silicon oxide layer which is subsequently deposited by APCVD using TEOS and $O_3$ (ozone).

Sukharev, U.S. Pat. No. 5,710,079 cites an APCVD process for the deposition of silicon oxide from TEOS in the presence of ozone, water, and hydrogen peroxide wherein ultraviolet radiation is employed to enhance the decomposition of ozone molecules. The atomic oxygen thereby produced reacts with water molecules to produce hydroxyl radicals which, in turn, enhance the decomposition of TEOS. The deposition rate of the film is increased and the occurrence of bubbles and voids in the film is reduced.

In the current application, a BPTEOS (BPSG deposited from TEOS and doped with boron and phosphorous) layer is deposited onto a PECVD silicon oxide layer by an APCVD process using ozone. BPSG is used extensively as an inter-level dielectric since it combines protection against instability due to ionic contamination and can be reflowed at low temperatures to improve surface planarity.

Unlike APCVD TEOS silicon oxide films, APCVD BPSG films do not exhibit surface roughness or bubble occlusion. However, the APCVD BPSG films are less dense than corresponding BPSG films formed by LPCVD or PECVD. Generally films deposited by APCVD or SACVD are of lower density than corresponding films deposited by other CVD methods. As a result, the APCVD BPSG films shrink considerably during a subsequent reflow process step. APCVD silicon oxide films do not experience such shrinkage and do not flow to any appreciable extent during subsequent annealing. It has been found by the present investigators that in regions where a composite PECVD silicon oxide/APCVD BPSG IMD (inter metal dielectric) layer dips into narrow, high aspect ratio, pockets, such as between closely spaced polysilicon gate lines in memory circuits, there is a tendency for the APCVD BPSG layer to detach from the subjacent oxide layer. This delamination is a direct result of the high stresses induced in these narrow regions by the shrinkage of the BPSG layer during annealing.

FIG. 1A and FIG. 1B show an example to illustrate the formation of voids in high aspect ratio pockets. Referring first to FIG. 1A, a wafer silicon 10 with two parallel conductive lines 14 is shown in cross section, the conductive lines 14 running perpendicular to the plane of the page. The conductive lines 14 are shown patterned over a silicon oxide layer 12. In order to form an interlevel dielectric layer over the conductive lines 14, a silicon oxide layer 18 is first conformally deposited over the line 14 by a CVD process. Next a thicker layer of BPSG 20 is deposited over the silicon oxide layer 18. The method of choice for depositing the BPSG layer 20 is APCVD which tends to form films of lower density than other CVD methods.

Referring now to FIG. 1B, the surface of the BPSG layer 20 is planarized by thermally reflowing at a temperature of about 900° C. At this temperature the BPSG is sufficiently fluid to flow towards a planar surface. The dashed line 21 in the figure denotes the original surface (FIG. 1A) shown before thermal reflow treatment. However, it has been observed by the current investigators, that if the density of the as-deposited BPSG 20 is too low, the greater amount of shrinkage of the BPSG layer within the high aspect ratio pocket 16 is too great to be compensated by fluid flow. As a result, the BPSG detaches from the underlying silicon oxide during the reflow step and a void 22 is formed in the base of the pocket 16. Once detachment occurs, surface tension of the BPSG over the void 16 sustains and enhances the detachment.

The probability of void formation depends upon the aspect ratio of the pocket 16 and the magnitude of the respective depth or width of the pocket. The presence of voids is undesirable and usually leads to yield losses due to shorts, leakages, and overall performance degradation. Detachment of thick APCVD silicon oxide films from subjacent thinner films is not observed by either Suzuki or Murao because, although subjected to high annealing temperature, the APCVD silicon oxide films do not flow as the BPSG films and therefore do not shrink to the extent that the BPSG film 20 does.

It would therefore be desirable to have an improved method for forming a BPSG layer over a PECVD silicon oxide layer by APCVD which would reduce the amount of thermal shrinkage of the BPSG during reflow and thereby prevent detachment of the BPSG layer in regions of high aspect ratio depressions in the subjacent silicon oxide layer. The method of this invention provides such a solution.

SUMMARY OF THE INVENTION

It is an object of this invention to provide a method for forming an APCVD BPSG film which exhibits a reduced shrinkage during a planarization reflow process.

It is another object of this invention to provide a method for forming an interlevel dielectric layer which can be reflowed to achieve planarization at temperatures between about 850 and 950° C. without void formation or delamination of regions of the layer.

It is yet another object of this invention to provide an improved method for forming an APCVD BPSG layer on a silicon oxide layer and thermally flowing said BPSG layer without causing delamination or void formation.

It is still another object of this invention to provide a method for preventing the formation of voids in high aspect ratio topographic interfacial features such as pockets or trenches in the structure beneath an APCVD flowable glass layer during the thermal reflow of said flowable glass layer.

These objects are accomplished by depositing the APCVD BPSG layer under conditions which promote the formation of a higher density deposit without degrading the filling and planarizing capacity of the layer. These conditions include providing a flow ratio of ozone to TEOS precursor of at least 12:1 and preferably greater than 14:1.

DESCRIPTION OF THE PREFERRED EMBODIMENTS

In a first embodiment of this invention a BPSG layer is formed over a PECVD silicon oxide layer on a split gate flash EEPROM cell by an APCVD process. Shown in FIG. 2A is a cross section of a split gate flash memory cell at a stage in processing where the control gate and floating gates have been patterned.

Figure 1A:
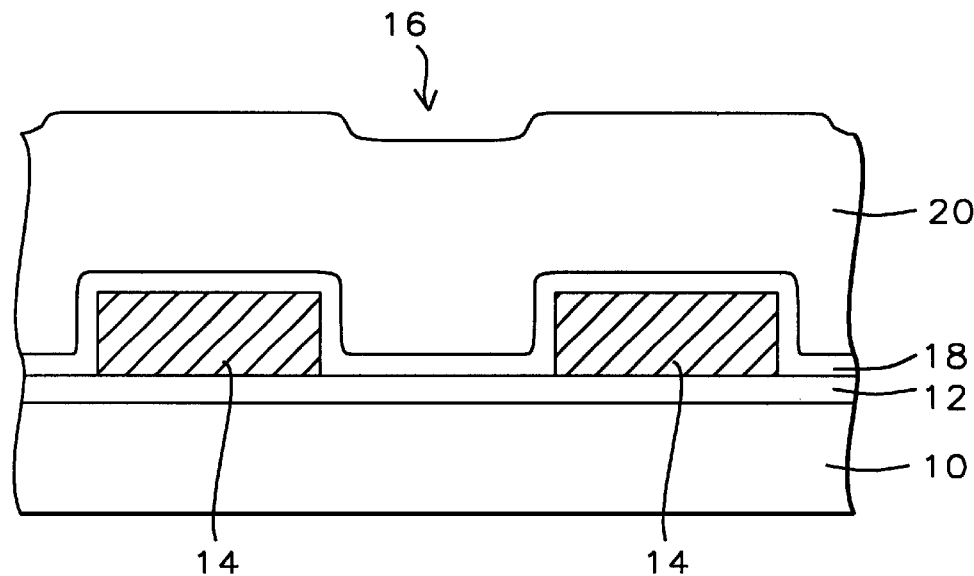
FIG. 1A is a cross section of a structure showing a as-deposited low density, APCVD BPSG layer over a structure comprising two adjacent conductive lines coated with a conformal silicon oxide layer.
Figure 1B:
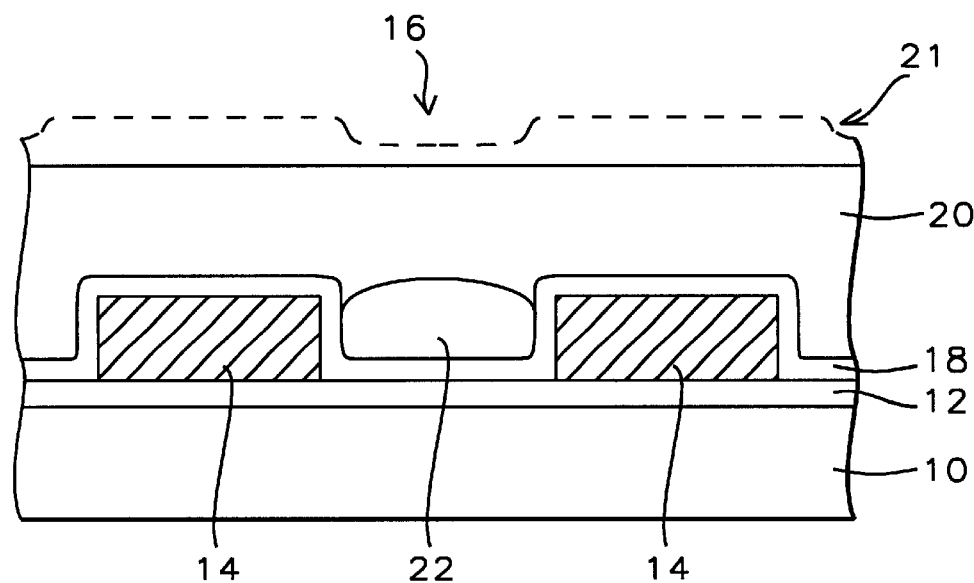
FIG. 1B is a cross section of a structure showing a thermally reflowed low density, APCVD BPSG layer deposited over a structure comprising two adjacent conductive lines coated with a conformal silicon oxide layer.
Figure 2A:
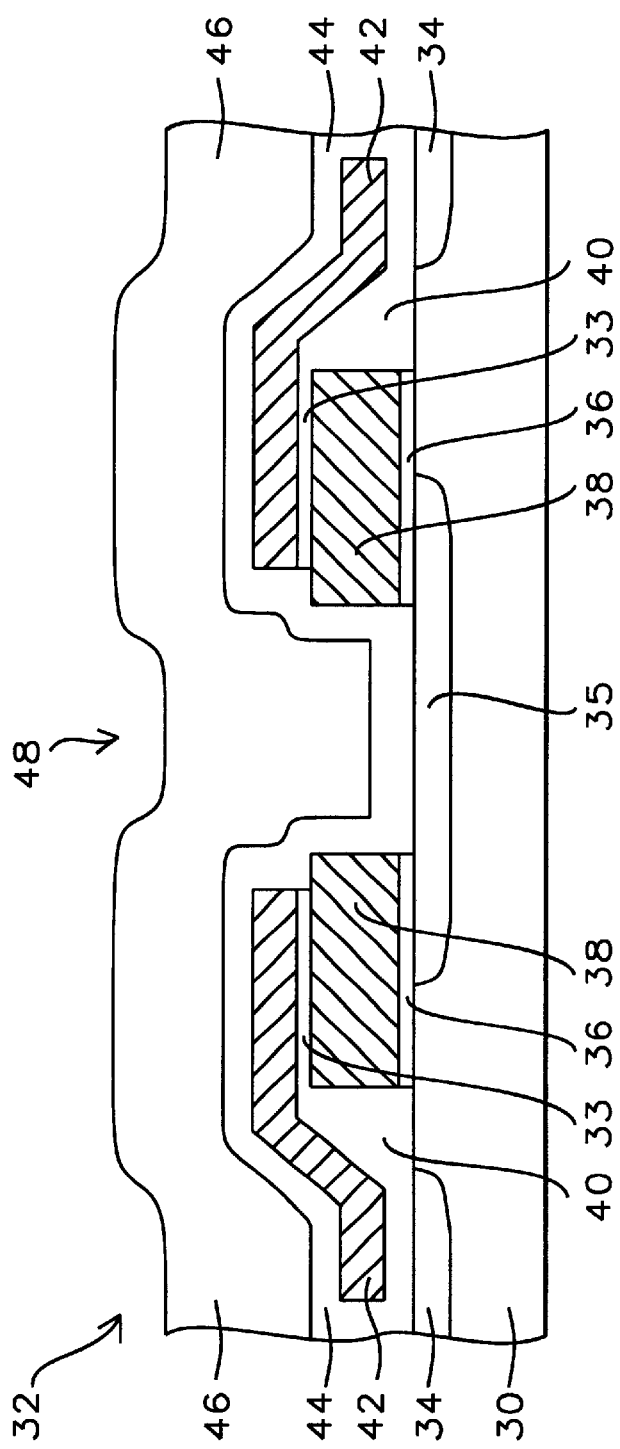
FIG. 2A is a cross section of an in-process SEEQ flash memory cell after an interlevel dielectric layer containing a BPSG sub-layer, has been deposited over the double polysilicon structure according to the teaching of this invention.

Referring to FIG. 2A, a p-type wafer 30 with a split gate flash EEPROM (electrically erasable programmable read only memory) cell structure 32, generally referred to as a SEEQ cell is provided. See Wolf, S., "Silicon Processing for the VLSI Era", Vol.2, Lattice Press, Sunset Beach, Calif., (1990), p635. These memory arrays have closely spaced floating gates with superjacent control gates. The gate structures are patterned in dual polysilicon layers. Floating gates 38 lie over a gate oxide 36. The control gates 42 overlap the floating gates 38, and are separated from them by a thin silicon oxide region 33. Source 34 and drain 35 regions are formed in the semiconductor surface. The insulator 40 provides contiguous insulation under the control gates 42. The processing of the semiconductor device elements and the formation of the polysilicon structures is done by methods well known to those in the art.

A layer of silicon oxide 44 is deposited over the dual polysilicon gate structure 32 by PECVD at a temperature of between about 350 and 450° C. The silicon oxide layer 44 is conformal over the polysilicon structure. A layer of BPSG 46 is deposited over the oxide layer 44 to form the upper portion of an interlevel dielectric layer. The BPSG layer 46 is deposited by APCVD at a temperature of between about 350 and 550° C. in a commercial CVD deposition tool, for example, the Model WJ-999 manufactured by the Watkin-Johnson Company of Palo Alto, Calif. The BPSG layer 46 is deposited tool using TEOS, TMB (trimethyl phosphite) and ozone ($O_3$) precursors in a nitrogen carrier gas. It is key to the procedure that the ratio of the $O_3$ flow rate to the TEOS flow rate be at least about 12:1 and more preferably greater than about 14:1. By increasing the $O_3$ flow rate with respect to the TEOS flow rate, a denser BPSG film is produced. Consequently, the shrinkage of the BPSG layer during subsequent thermal flowing is reduced.

Figure 2B:
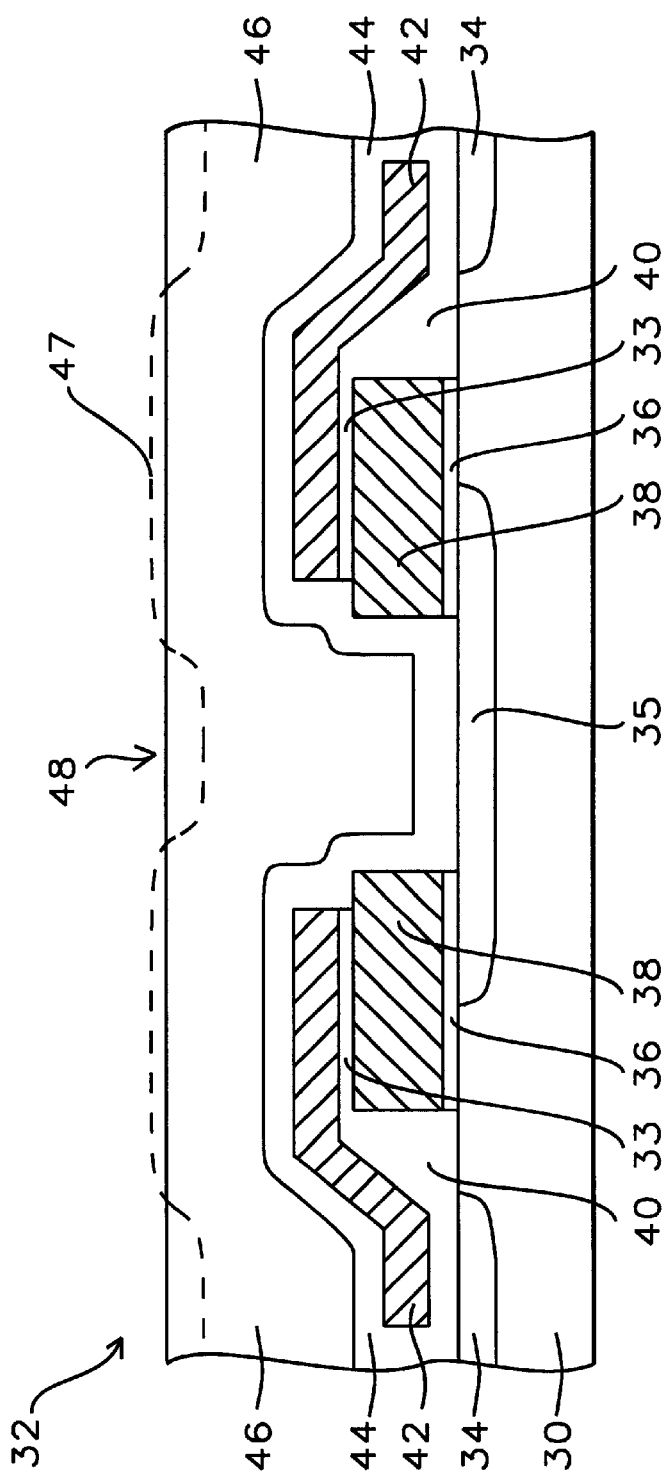
FIG. 2B is a cross section of an in-process SEEQ flash memory cell after an the interlevel dielectric layer containing a BPSG sub-layer shown in FIG. 2A has been thermally reflowed.

After deposition, the BPSG layer 46 is planarized by flowing in a furnace at a temperature of between about 850 and 950° C. in a nitrogen ambient. At these temperatures the BPSG is sufficiently fluid to flow towards a planar surface. Referring to FIG. 2B there is shown the cross section of the flash memory cell structure 32 after the thermal reflow process step. The dashed line 47 outlines the original surface. The upper surface of the BPSG layer 46 is planarized but the shrinkage of the BPSG is sufficiently reduced that there is no detachment of the BPSG 46 from the subjacent silicon oxide layer 44 in the depression 48.

Figure 3:
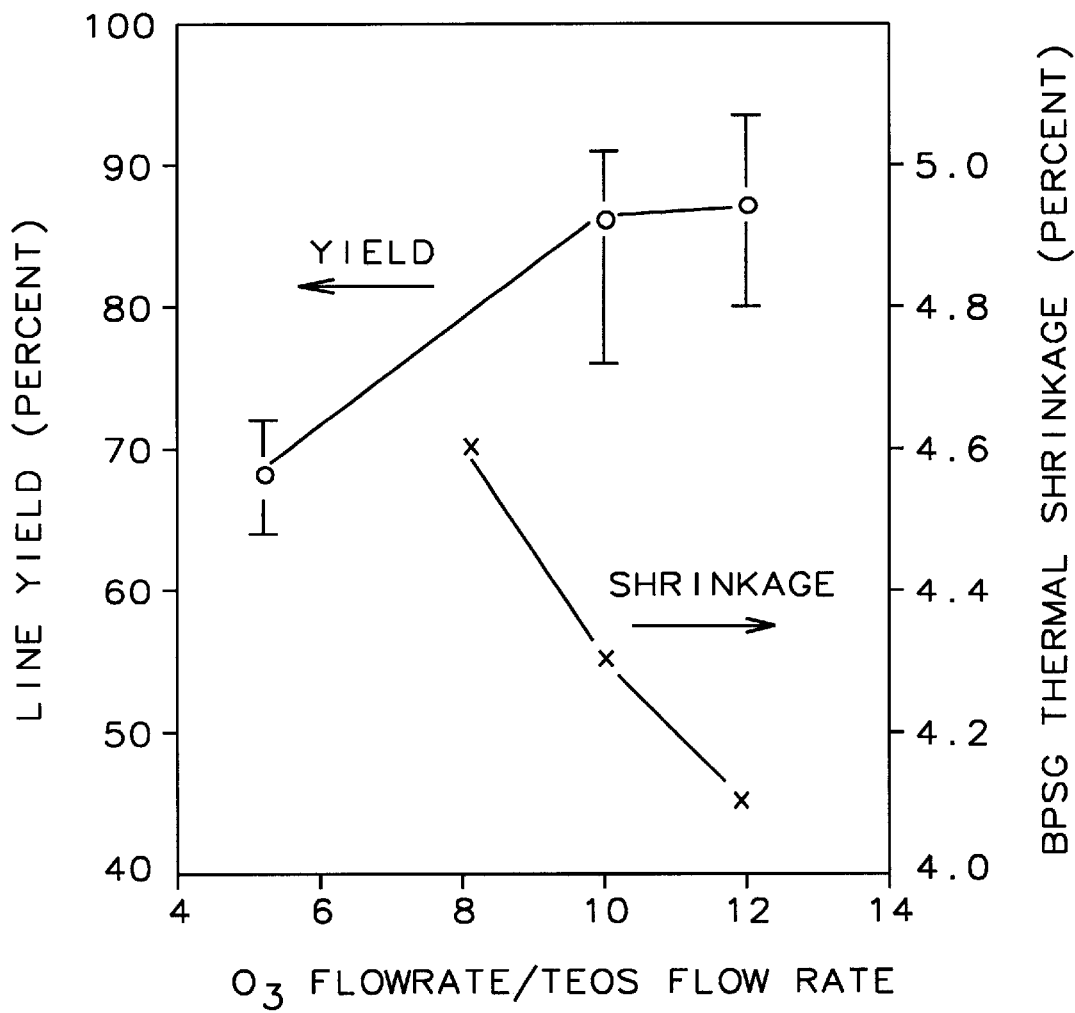
FIG. 3 is a graph showing the thermal shrinkage of an APCVD BPSG layer after thermal reflow as a function of the ozone/TEOS flow rate ratio used to deposit the layer. The corresponding dependence of the yield of defect-free polysilicon gate lines on the ozone/TEOS flow rate ratio is also shown.

Occurrences of delamination of the BPSG film 46 from the underlying silicon oxide layer 44 in the depression 48 are referred to as line defects and can be measured by observation and count of the line defects by optical microscopy. A line yield is then obtained by calculating the percentage of lines without defects. FIG. 3 is a chart showing the percentage reduction in shrinkage of a BPSG film as a function of the $O_3$/TEOS flow rate ratio. The thermal shrinkage is defined as the difference in thickness of the BPSG layer before and after reflow divided by the initial thickness:

$$\text{Thermal shrinkage } (\%) = \frac{\text{Thickness before reflow} - \text{Thickness after reflow}}{\text{Thickness before reflow}}$$

By increasing the $O_3$/TEOS flow rate ratio from 8:1 to 12:1 the shrinkage is reduced by about 11 percent (from 4.6% to 4.1%).

Also shown in FIG. 3 is the line yield as a function of $O_3$/TEOS flow rate ratio. The data clearly show that the line yield improves as the density of the as-deposited BPSG is reduced by increasing the $O_3$/TEOS flow rate ratio.

Figure 4A:
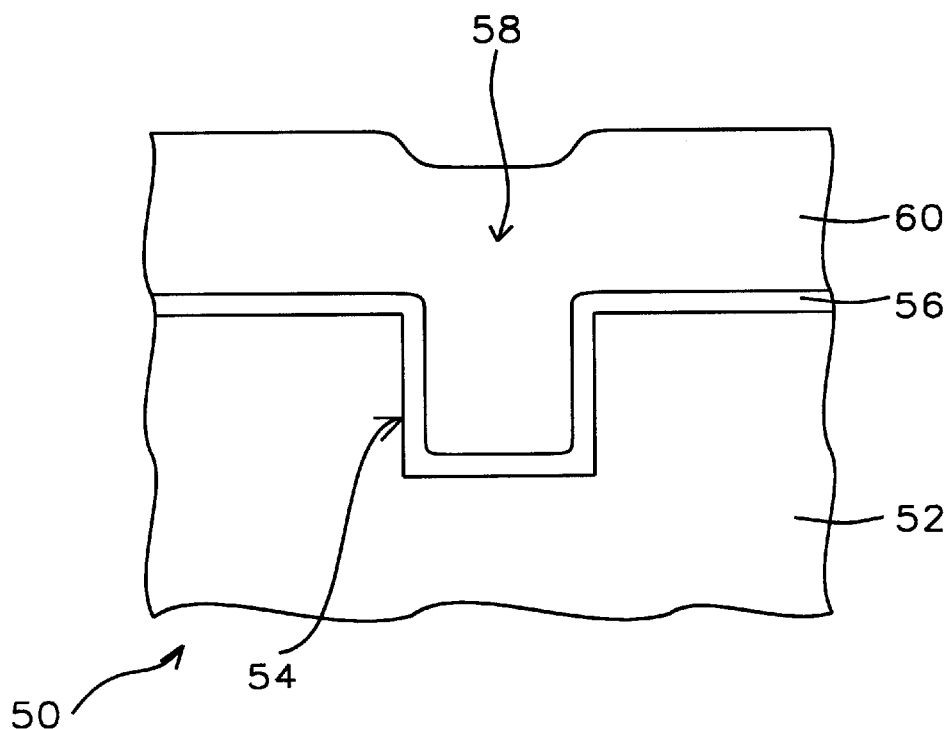
FIG. 4A is a cross section of a structure showing an as-deposited APCVD BPSG layer, formed according to the method of this invention, over a structure coated with a conformal silicon oxide layer and having a depression.
Figure 4B:
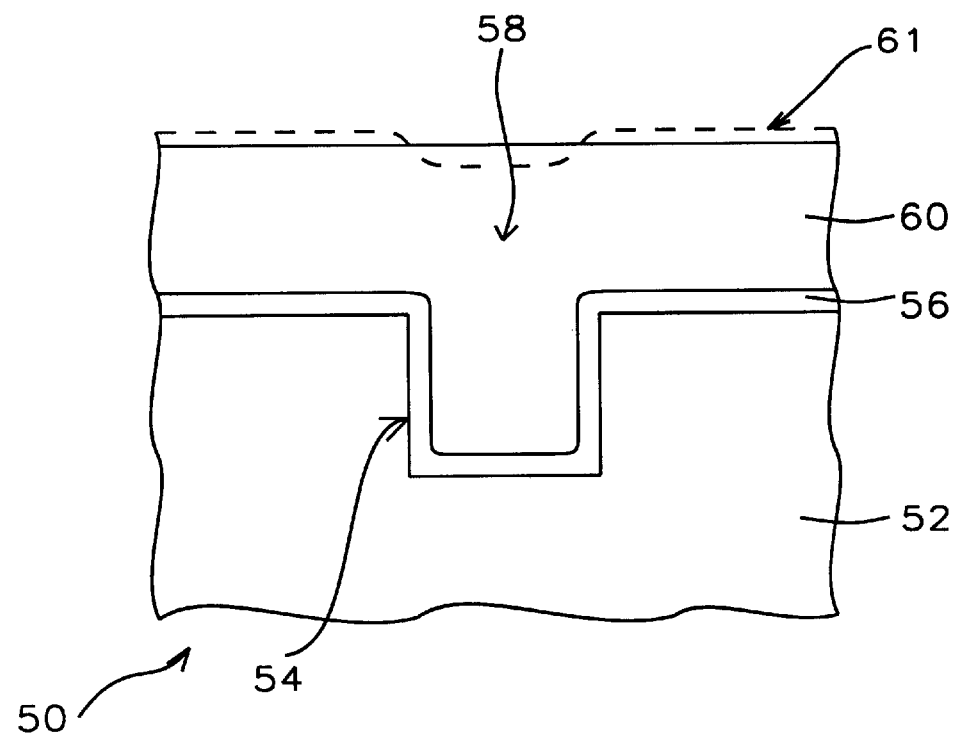
FIG. 4B is a cross section of a structure showing an APCVD BPSG layer deposited according to the method of this invention, over a structure with a depression coated with a conformal silicon oxide layer, after a thermal reflow process.

In a second embodiment of this invention a BPSG layer is formed over a silicon oxide layer. This embodiment addresses a more general form of the invention and applies to a structure on a wafer with a surface topography which includes a depression. The silicon oxide layer deposits conformally over structure and thereby essentially replicates the surface topography of the structure. Shown in FIG. 4A is a cross section of a structure 52 on a silicon wafer 50. The structure includes a depression 58 which in the current embodiment is a trench. A silicon oxide layer 56 is formed conformally over the structure 52. It the current embodiment the silicon oxide layer 56 is deposited by CVD at a temperature between about 350 and 450° C. Alternatively, if the structure 52 is the silicon wafer 50 itself, the silicon oxide layer 56 may be formed by thermal oxidation.

A layer of BPSG 60 is deposited over the oxide layer 56. The BPSG layer 60 is deposited by APCVD at a temperature of between about 350 and 550° C. in a commercial CVD deposition tool, for example, the Model WJ-999 manufactured by Watkin-Johnson Company of Palo Alto, Calif. The BPSG layer 60 is deposited using TEOS, TMB (trimethyl phosphite) and ozone ($O_3$) precursors in a nitrogen carrier gas. It is key to the procedure that the ratio of the $O_3$ flow rate to the TEOS flow rate be at least about 12:1 and more preferably greater than about 14:1. By increasing the $O_3$ flow rate with respect to the TEOS flow rate, a denser BPSG film is produced. Consequently, the shrinkage of the BPSG layer during subsequent thermal flowing is reduced.

After deposition, the BPSG layer 60 is planarized by thermally flowing in a furnace at a temperature of between about 850 and 950° C. in an ambient of nitrogen. At these temperatures the BPSG is sufficiently fluid to flow towards a planar surface. Referring to FIG. 3B there is shown a cross section of the trench structure 52 on the wafer 50 after the thermal reflow process step. The dashed line 61 indicates the surface of the BPSG layer 60 before the thermal reflow step. The upper surface of the BPSG layer 60 is planarized but the shrinkage of the BPSG is sufficiently reduced that there is no detachment of the BPSG 60 from the subjacent silicon oxide layer 56 in the depression 58.

The embodiments use silicon wafers. It should be well understood by those skilled in the art that other semiconductor substrates may also be used and, by applying the procedures taught by this invention, the same objectives may be achieved. While the invention has been particularly shown and described with reference to the preferred embodiments thereof, it will be understood by those skilled in the art that various changes in form and details may be made without departing from the spirit and scope of the invention.

Whereas the boron and phosphorous BPSG precursors used in the embodiment are TMB (trimethyl phosphite) and TMP (trimethyl borate) respectively, other such precursors, for example TMPO (trimethyl phosphate), diborane, or (SiOB) tris(trimethyl silyl) borate may be used as well. Similarly the silicate precursor is not confined to TEOS but may be another suitable precursor such as tetrapropoxy silane.

Whereas the embodiments of this invention illustrates the formation of a dielectric layer containing a layer of APCVD BPSG, on a flash memory device and a trench respectively, the principles and spirit of the invention may be applied equally to other structures wherein depressions of similar magnitude and aspect ratio are coated with BPSG or other flowable glass layer which is subsequently thermally flowed to planarize the glass.

What is claimed is:

1. A method for forming an insulative layer on a substrate having a depression comprising:

(a) providing a substrate wafer having a structure with a surface which includes a depression;

(b) forming a silicon oxide layer over said surface;

(c) forming a BPSG layer on said silicon oxide layer by atmospheric pressure CVD using a gas flow containing tetraethoxysilane, a boron precursor, selected from the group consisting of trimethyl borate, diborane, and tris(trimethl silyl borate, a phosphorous precursor, selected from the group consisting of trimethyl phosphite and trimethyl phosphate, and ozone in a proportion such that the flow rate of said ozone is at least 12 times greater than the flow rate of said tetraethoxysilane; and (d) subjecting said substrate wafer to a thermal treatment at a temperature between about 850 and 900° C. thereby causing said BPSG layer to flow.

2. The method of claim 1 wherein said silicon oxide layer is deposited by chemical vapor deposition.

3. The method of claim 1 wherein said depression is a trench.

4. The method of claim 1 wherein said BPSG is deposited at a temperature of between about 350 and 550° C.

5. The method of claim 1 wherein said thermal treatment is conducted in a furnace in a nitrogen ambient.

6. A method for forming an interlevel dielectric layer on a dual polysilicon structure comprising:

(a) providing a silicon wafer having a dual polysilicon structure with a surface concavity between adjacent polysilicon elements;

(b) forming a silicon oxide layer over said structure;

(c) forming a BPSG layer on said silicon oxide layer by atmospheric pressure CVD using a gas flow containing tetraethoxysilane, a boron precursor, selected from the group consisting of trimethyl borate, diborane, and tris(trimethl silyl) borate, a phosphorous precursor, selected from the group consisting of trimethyl phosphite and trimethyl phosphate, and ozone in a proportion such that the flow rate of said ozone is at least 12 times greater than the flow rate of said tetraethoxysilane; and (d) subjecting said silicon wafer to a thermal treatment at a temperature between about 850 and 900° C. thereby causing said BPSG layer to flow.

7. The method of claim 6 wherein said silicon oxide layer is deposited by chemical vapor deposition.

8. The method of claim 6 wherein said BPSG is deposited at a temperature of between about 350 and 550° C.

9. The method of claim 6 wherein said thermal treatment is conducted in a furnace in a nitrogen ambient.

* * * * *